US012635171B2

(12) United States Patent
Chun et al.

(10) Patent No.: US 12,635,171 B2
(45) Date of Patent: May 19, 2026

(54) SEMICONDUCTOR DEVICE AND METHOD OF MANUFACTURING THE SAME

(71) Applicants:HYUNDAI MOTOR COMPANY, Seoul (KR); KIA CORPORATION, Seoul (KR)

(72) Inventors: Dae Hwan Chun, Suwon-si (KR); Junghee Park, Suwon-si (KR); Jungyeop Hong, Seoul (KR); Taehyun Kim, Suwon-si (KR); Youngkyun Jung, Seoul (KR); NackYong Joo, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 380 days.

(21) Appl. No.: 18/517,723

(22) Filed: Nov. 22, 2023

(65) Prior Publication Data

US 2025/0006843 A1 Jan. 2, 2025

(30) Foreign Application Priority Data

Jun. 30, 2023 (KR) ........................ 10-2023-0084844

(51) Int. Cl.
  *H10D 30/62* (2025.01)
  *H10D 62/80* (2025.01)
  *H10D 99/00* (2025.01)
(52) U.S. Cl.
  CPC ............. *H10D 30/62* (2025.01); *H10D 62/80* (2025.01); *H10D 99/00* (2025.01)

(58) Field of Classification Search
  CPC ........ H10D 30/62–6219; H10D 30/024–0245; H10D 30/471–478; H10D 30/015; H10D 62/292; H10D 64/025; H10D 64/027; H10D 64/513
  See application file for complete search history.

(56) References Cited

U.S. PATENT DOCUMENTS

2015/0162427 A1* 6/2015 Lee .................... H10D 30/4755
                                                    257/190

FOREIGN PATENT DOCUMENTS

CN        115732566 A * 3/2023

OTHER PUBLICATIONS

CN11532566A machine translation (Year: 2026).*

* cited by examiner

*Primary Examiner* — Vincent Wall
(74) *Attorney, Agent, or Firm* — MCDONNELL BOEHNEN HULBERT & BERGHOFF LLP

(57) ABSTRACT

A semiconductor device includes a substrate, a buffer layer on the substrate, an n– type epitaxial layer extending upward from the buffer layer in one direction, and having a fin channel, a p type layer disposed on the buffer layer and surrounding the side and upper surfaces of the n– type epitaxial layer, a gate insulating layer on the p type layer, and a gate electrode on the gate insulating layer.

11 Claims, 11 Drawing Sheets

FIG. 4

Fin channel;
forming a three-dimensional
channel surface with three sides

C-C' cross-section: On state

Diffusion of depletion layer from PN
junction of channel region with
three sides → depletion of the entire
region of n- type epitaxial layer C-C' cross-section: Off state

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2023-0084844 filed in the Korean Intellectual Property Office on Jun. 30, 2023, the entire contents of which are incorporated herein by reference.

BACKGROUND

(a) Field

A semiconductor device and a method of manufacturing the same are disclosed.

(b) Description of the Related Art

Power conversion devices such as inverters, converters, and OBC (on board charge) play the role of converting electrical energy into a form suitable for electrical components, and power semiconductors perform switching and rectification operations in the components responsible for power conversion.

Existing power semiconductors mainly used silicon (Si) materials, but recently, gallium nitride (GaN) and silicon carbide (SiC) power semiconductors with improved performance have begun to be mass-produced and installed in vehicles.

Gallium oxide ($Ga_2O_3$), which is attracting attention as a next-generation compound semiconductor material, has a high critical electric field, excellent electron transport ability, and is capable of growing on high-quality large-area substrates, so that it has the advantage of not only better performance than existing GaN or SiC but also ease of manufacturing process. Therefore, $Ga_2O_3$-based power semiconductors are expected to be competitive in various fields such as high-power devices, RF devices, and short-wavelength optical devices.

In relation to this, an ion implantation process method for forming p type $Ga_2O_3$ has recently been studied, but it is not stable enough to commercialize it.

SUMMARY

An embodiment provides a semiconductor device that can be manufactured without an ion implantation process, has an increased channel density while implementing normally-off operation, and has an increased breakdown voltage.

Another embodiment provides a method of manufacturing the semiconductor device.

According to an embodiment, a semiconductor device includes a substrate, a buffer layer positioned on the substrate, an n− type epitaxial layer extending upward from the buffer layer in one direction, and having a fin channel, a p type layer positioned on the buffer layer and surrounding side and upper surfaces of the n− type epitaxial layer, a gate insulating layer positioned on the p type layer, and a gate electrode positioned on the gate insulating layer.

The semiconductor device may further include a source electrode disposed on one side at a distance from the gate electrode; and a drain electrode disposed on an other side at a distance from the gate electrode.

The semiconductor device may further include an n+ type epitaxial layer disposed between the n− type epitaxial layer and the source electrode, and between the n− type epitaxial layer and the drain electrode at a position spaced apart from the gate electrode, a protective layer disposed on the buffer layer or on the n− type epitaxial layer in a region where the gate electrode is not disposed, or a combination thereof.

The p type layer on the buffer layer may be disposed lower than a lower surface of the protruding n− type epitaxial layer.

The p type layer may include $NiO_X$ ($0.98 \le x \le 1$).

The buffer layer may include unintentionally doped (UID) gallium oxide.

The n− type epitaxial layer may include n− type gallium oxide.

The n− type epitaxial layer may have a concentration of about 1E16 $cm^{-3}$ to about 1E19 $cm^{-3}$.

The gate insulating layer may include $Al_2O_3$, $SiO_2$, $HfO_2$, $Si_2N_3$ or a combination thereof.

The protective layer may include $SiO_2$, $Si_2N_3$, or a combination thereof.

The n+ type epitaxial layer may include n+ type gallium oxide.

According to another embodiment, a method of manufacturing a semiconductor device includes sequentially forming a buffer layer and an n− type epitaxial layer on a substrate; etching a portion of the n− type epitaxial layer to form a protruding structure; forming a protective layer on the buffer layer and the n− type epitaxial layer along the protruding structure; etching a portion of the protective layer and the buffer layer; forming a p type layer on the partially etched buffer layer and the n− type epitaxial layer along the protruding structure; forming a gate insulating layer on the p type layer; and forming a gate electrode on the gate insulating layer.

The forming of the p type layer, the gate insulating layer, and the gate electrode may be performed by a lift-off process or an etching process.

The p type layer on the buffer layer may be formed at a lower position than the lower surface of the protruding n− type epitaxial layer.

Before the etching of the n− type epitaxial layer, the method may further include forming an n+ type epitaxial layer on the n− type epitaxial layer and etching the n+ type epitaxial layer.

After the forming of the gate electrode, the method may further include forming a source electrode and a drain electrode on the n+ type epitaxial layer and the protective layer.

The forming of the source electrode and the drain electrode may be performed by a lift-off process or an etching process.

The p type layer may include $NiO_X$ ($0.98 \le x \le 1$).

A semiconductor device according to an embodiment can be manufactured without an ion implantation process, has increased channel density while implementing normally-off operation, increases threshold voltage, and eliminates gate leakage current, and may have increased breakdown voltage characteristics.

BRIEF DESCRIPTION OF THE DRAWINGS

FIG. 4 is a cross-sectional view taken along line B-B' of the structure of FIG. 1.

DETAILED DESCRIPTION

Figure 1:
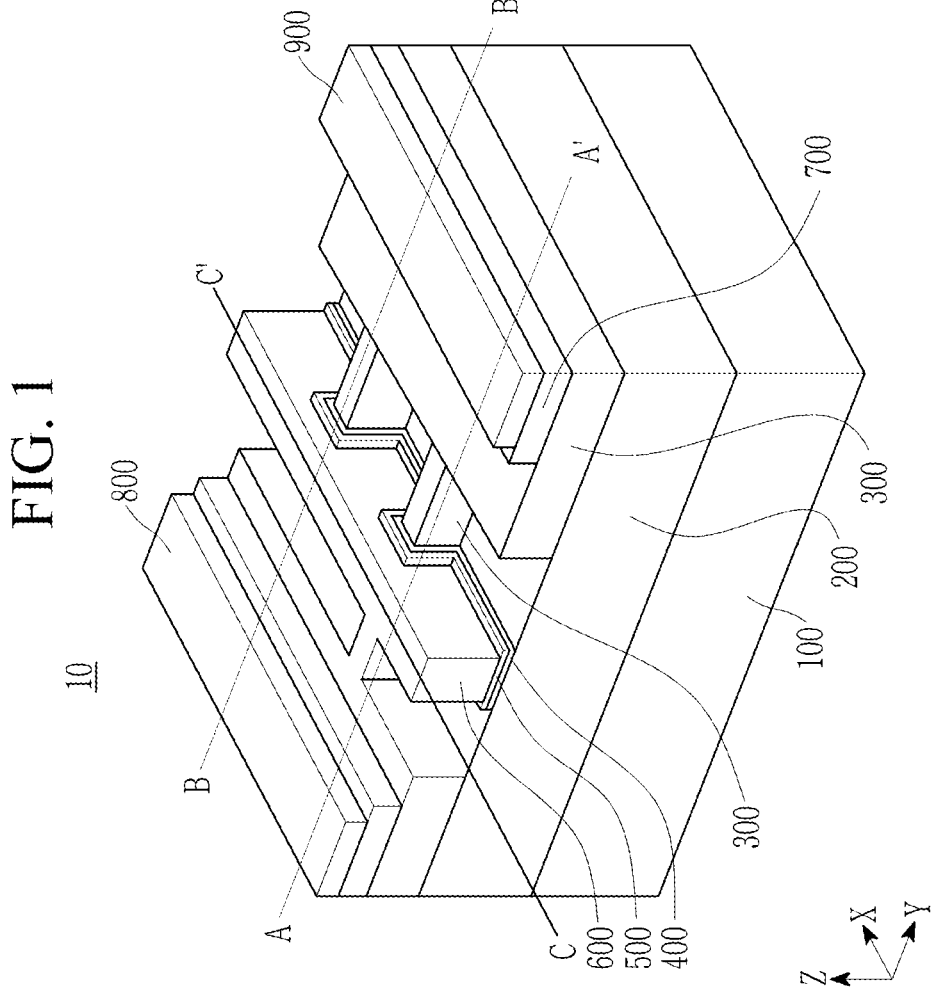
FIG. 1 is a perspective view briefly illustrating a structure of a semiconductor device according to an embodiment.

The advantages, features, and aspects to be described hereinafter will become apparent from the following description of the embodiments with reference to the accompanying drawings, which is set forth hereinafter. However, the embodiments should not be construed as being limited to the embodiments set forth herein. Although not specifically defined, all of the terms including the technical and scientific terms used herein have meanings understood by ordinary persons skilled in the art. The terms defined in a generally-used dictionary may not be interpreted ideally or exaggeratedly unless clearly defined. Throughout the specification and claims which follow, unless explicitly described to the contrary, the word "comprise/include" or such variations as "comprises/includes" or "comprising/including" will be understood to imply the inclusion of stated elements but not the exclusion or any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The semiconductor device according to an embodiment has a metal oxide semiconductor field effect transistor (MOSFET) structure based on gallium oxide (Ga2O3), an ultra-wide band gap (UWBG) material, and has a structure using a three-dimensional gate with a fin channel.

Figure 2:
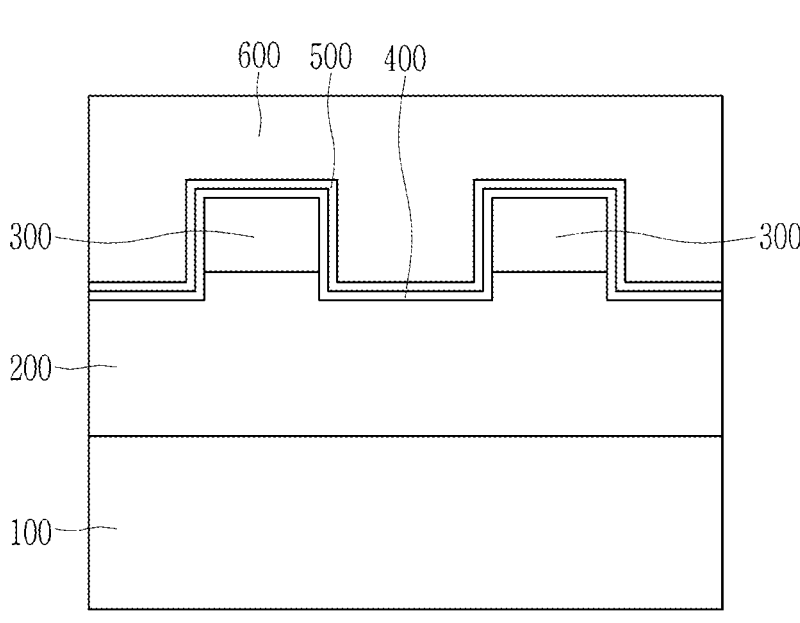
FIG. 2 is a cross-sectional view taken along line C-C' of the structure of FIG. 1.
Figure 3:
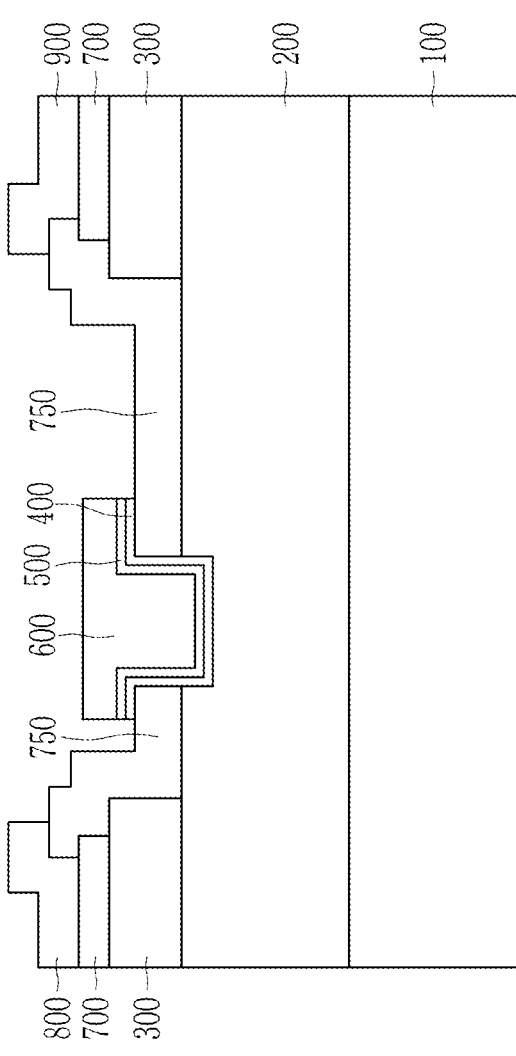
FIG. 3 is a cross-sectional view taken along line A-A' of the structure of FIG. 1.
Figure 4:
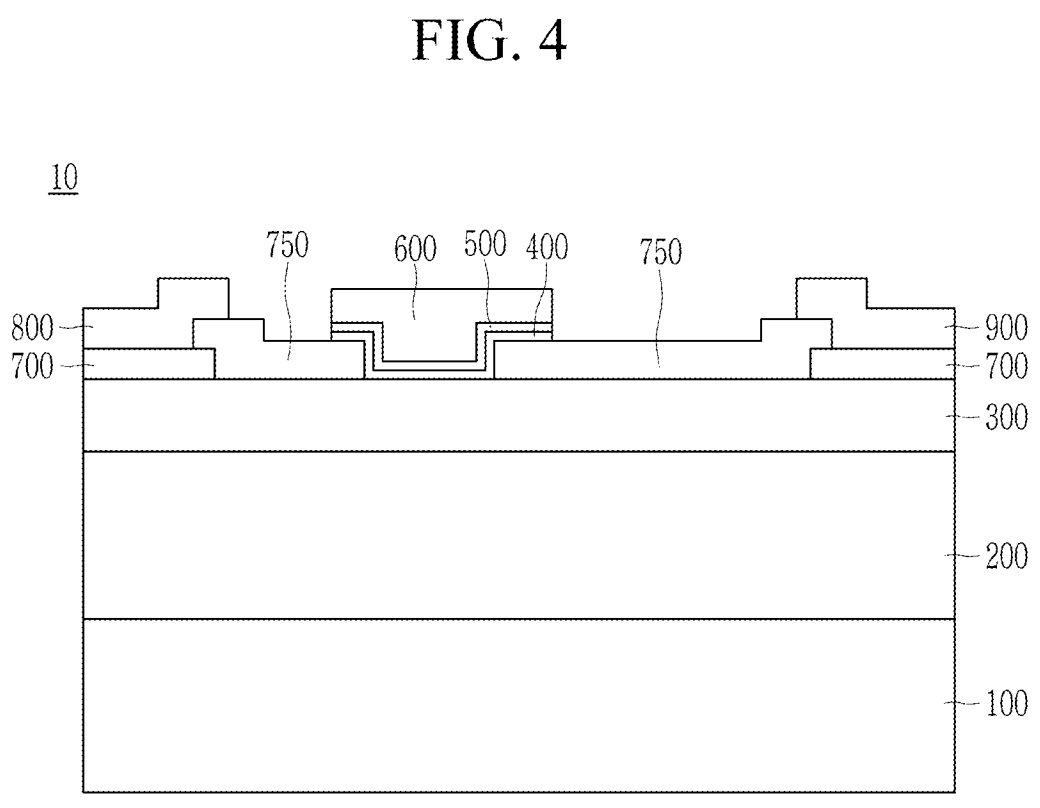

FIG. 1 is a perspective view briefly illustrating a structure of a semiconductor device according to an embodiment, FIG. 2 is a cross-sectional view taken along line C-C' of the structure of FIG. 1, FIG. 3 is a cross-sectional view taken along line A-A' of the structure of FIG. 1, and FIG. 4 is a cross-sectional view taken along line B-B' of the structure of FIG. 1.

In FIG. 1, the C-C cross-section indicates a cross-section cut in a direction of the gate electrode 600, that is, an X direction in the drawing. In addition, the A-A' cross-section in FIG. 1 indicates a cross-section cut in a perpendicular direction to the gate electrode 600, that is, a Y direction in the drawing, which is a cross section cut across a region where the n– type epitaxial layer 300 with a three dimensional fin channel is not present. In addition, in FIG. 1, the B-B' cross-section indicates a cross-section cut in a perpendicular direction to the gate electrode 600, that is, the Y direction in the drawing, which is a cross-section cut across a region where the n– type epitaxial layer 300 with a three dimensional fin channel is present.

Referring to FIGS. 1 and 2, the semiconductor device 10 according to an embodiment includes a substrate 100, a buffer layer 200, an n– type epitaxial layer 300, a p type layer 400, a gate insulating layer 500, and a gate electrode 600.

The substrate 100 may include n+ type gallium oxide ($Ga_2O_3$), sapphire ($Al_2O_3$) or a combination thereof. The n+ type gallium oxide may be the one optionally doped with Si or Sn.

The buffer layer 200 may be disposed on the substrate 100 and may include unintentionally doped (UID) gallium oxide ($Ga_2O_3$).

The n– type epitaxial layer 300 is an epitaxial layer disposed to be protruded upward from the buffer layer 200 and to be extended in one direction, that is, in a perpendicular direction to the gate electrode 600 or the Y direction in the drawing.

In addition, the n– type epitaxial layer 300 internally has a fin channel. Specifically, the fin channel may be formed at both side regions and a top surface region in the n– type epitaxial layer 300, wherein the fin channel is formed at the three sides to obtain three-dimensional channel surface, which may increase channel density, that is, current density.

The n– type epitaxial layer 300 may include n– type gallium oxide ($Ga_2O_3$), and may optionally include n– type gallium oxide doped with Si or Sn.

The n– type epitaxial layer 300 may be formed by adjusting the impurity concentration of about 1E16 $cm^{-3}$ to about 1E19 $cm^{-3}$, and may have an impurity concentration of, for example, about 1E16 $cm^{-3}$ to about 1E18 $cm^{-3}$ within the above range. When the impurity concentration is in the above range, it is possible to secure appropriate values for use of the on-resistance and breakdown voltage characteristics, which are in a trade-off relationship.

The p type layer 400 is located on the buffer layer 200 and is arranged to surround the side and upper surfaces of the n– type epitaxial layer 300 that protrudes upward.

The p type layer 400 may include a p type semiconductor material, for example, $NiO_X$ ($0.98 \leq x \leq 1$).

In the case of a structure where the gate insulating layer and gate electrode are disposed sequentially on the buffer layer and on the n– type epitaxial layer without forming a p type layer, a strong negative voltage should be applied to keep the semiconductor device in the off state and there is a limit to an increase in breakdown voltage because the gate insulating layer under the gate electrode can be easily destroyed in the off state.

According to an embodiment, when the p type layer 400 disposed to surround the protruding n– type epitaxial layer 300 is applied, a depletion layer is formed between a p type semiconductor material of the p type layer 400 and an n– type gallium oxide ($Ga_2O_3$) of the n– type epitaxial layer 300, which may implement the normally-off operation. In addition, a thickness of the depletion layer may be controlled by a gate voltage to control an amount of MOSFET current and thus control on/off of the semiconductor device. Furthermore, the application of the p type semiconductor material may protect a gate insulating layer described later and disperse an off-state electric field, increasing a breakdown voltage.

The p type layer 400 disposed on the buffer layer 200, that is, on the upper surface of the buffer layer 200, may be located lower than the lower surface of the protruding n– type epitaxial layer 300.

The gate insulating layer 500 is disposed on the p type layer 400 and may be formed along the upper surface of the p type layer 400 with the same protruding structure as the n− type epitaxial layer 300.

The gate insulating layer 500 may include $Al_2O_3$, $SiO_2$, $HfO_2$, $Si_2N_3$, or a combination thereof, but is not limited thereto.

In a case of a structure that the p type layer and the gate electrode are sequentially disposed without the gate insulating layer, the normally-off operation may be implemented by the depletion layer formed on the PN junction by applying the p type semiconductor material, but a certain leakage current may occur even in the off state. In addition, since the PN structure of a gate region may be turned on in an on state of the semiconductor device, there is a problem of not applying a gate voltage at a certain level or higher.

According to an embodiment, the gate insulating layer 500 between the p type layer 400 and the gate electrode 600 may suppress the gate leakage current and increase a threshold voltage.

In addition, according to an embodiment, since the n− type epitaxial layer 300 internally has a three dimensional-shaped fin channel, the normally-off operation may be implemented, and a leakage current in the off state may not only be suppressed, but also channel density, that is, current density may be increased due to formation of the three-dimensional channel surface.

The gate electrode 600 is disposed on the gate insulating layer 500. The gate electrode 600 may include metals.

Referring to FIGS. 3 and 4 respectively showing the A-A' cross-section and the B-B' cross-section in the structure of FIG. 1, the semiconductor device 10 according to an embodiment may further include the n+ type epitaxial layer 700 spaced apart from the gate electrode 600. The n+ type epitaxial layer 700 may be disposed between the n− type epitaxial layer 300 and a source electrode 800 described later and between the n− type epitaxial layer 300 and a drain electrode 900 described later.

The n+ type epitaxial layer 700 may include n+ type gallium oxide ($Ga_2O_3$), and may optionally include n+ type gallium oxide doped with Si or Sn.

The semiconductor device 10 may further include a protective layer 750 disposed on the buffer layer 200 or the n− type epitaxial layer 300 in a region where the gate electrode 600 is not present.

The protective layer 750 may include $SiO_2$, $Si_2N_3$, or a combination thereof, but is not limited thereto.

The semiconductor device 10 may further include a source electrode 800 on one side at a distance from the gate electrode 600, and a drain electrode 900 on the other side at a distance from the gate electrode 600.

Figure 5A:
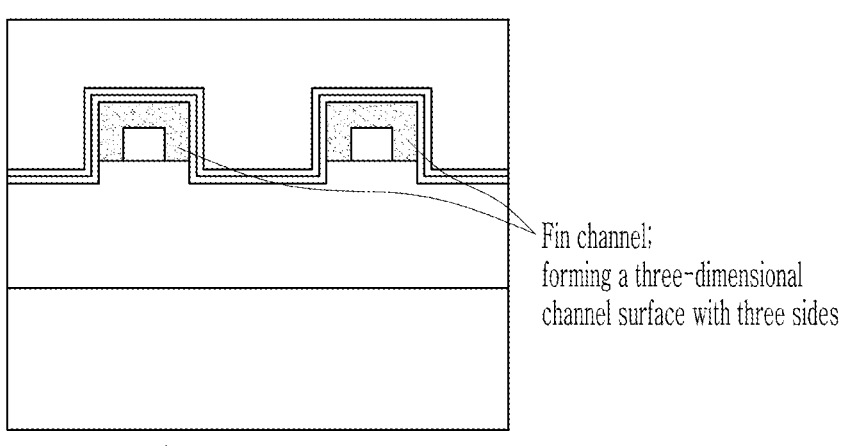
FIGS. 5A and 5B are a schematic view showing an increase in channel density in a semiconductor device according to an embodiment.
Figure 5B:
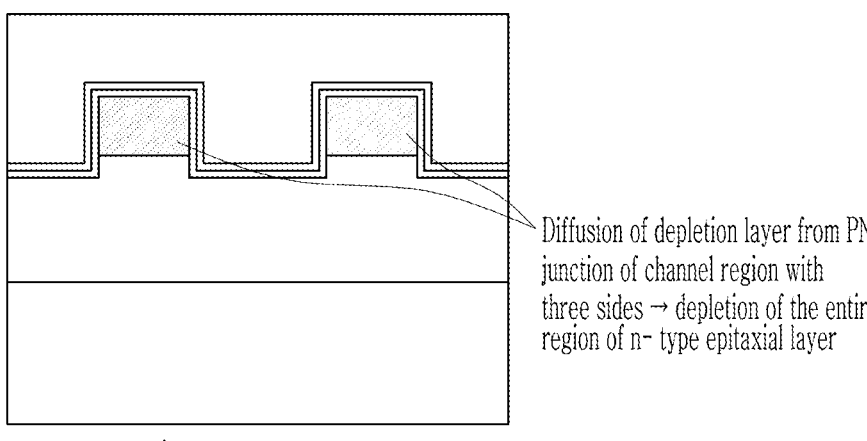

FIGS. 5A and 5B are a schematic view showing an increase in channel density in a semiconductor device according to an embodiment.

Referring to FIG. 5A, the fin channel may be formed at both side regions and the top surface region in the n− type epitaxial layer 300 in an on state of the semiconductor device, so that the fin channels formed on three sides may bring about a three-dimensional channel surface, increasing channel density, that is, current density.

In addition, Referring to FIG. 5B, in the off state of the semiconductor device, the depletion layer may diffuse from the PN junction of the channel regions at the three sides in the n− type epitaxial layer 300 to the entire region of the n− type epitaxial layer 300, which may more easily implement the normally-off operation and also suppress a leakage current.

Hereinafter, a method of manufacturing a semiconductor device will be described with reference to FIGS. 6A to 11B. This merely presents an example of a method for manufacturing a semiconductor device, and is not limited thereto.

FIGS. 6A to 11B are views sequentially showing a method of manufacturing a semiconductor device according to an embodiment. In the method of manufacturing a semiconductor device, each of FIGS. 6A, 7A, 8A, 9A, 10A, and 11A exhibits the C-C' cross-section in the structure of FIG. 1, that is, a region where a gate electrode is formed, and each of FIGS. 6B, 7B, 8B, 9B, 10B, and 11B exhibits the A-A' cross-section, that is, a region where a source electrode and a drain electrode are formed in the structure of FIG. 1. Herein, a material of each layer may be the same material as above and will not be repeatedly illustrated.

Figure 6A:
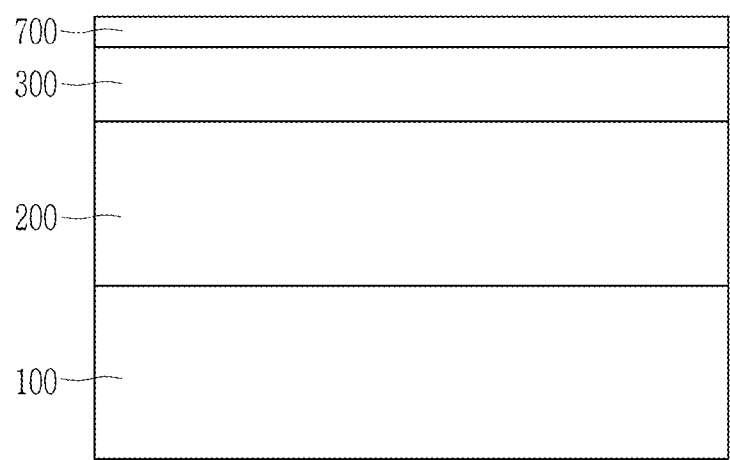
FIGS. 6A, 6B, 7A, 7B, 8A, 8B, 9A, 9B, 10A, 10B, 11A, and 11B are views sequentially showing a method of manufacturing a semiconductor device according to an embodiment.
Figure 6B:
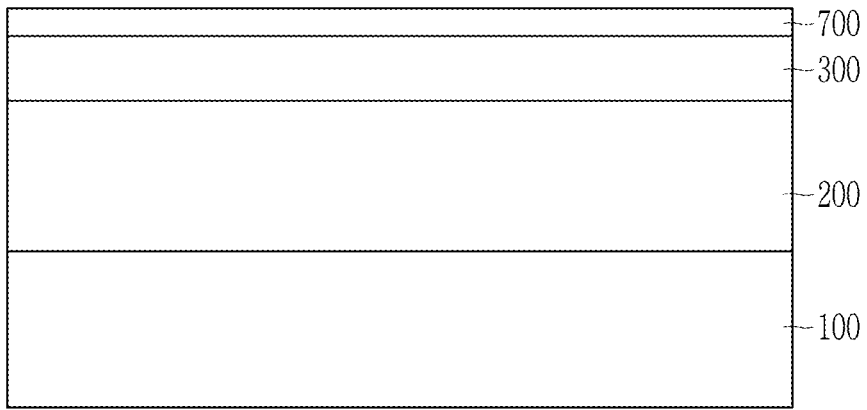

Referring to FIGS. 6A and 6B, the substrate 100 is prepared, and the buffer layer 200, the n− type epitaxial layer 300, and the n+ type epitaxial layer 700 may be sequentially formed on the substrate 100.

The n− type epitaxial layer 300 may be formed through epitaxial growth.

Figure 7A:
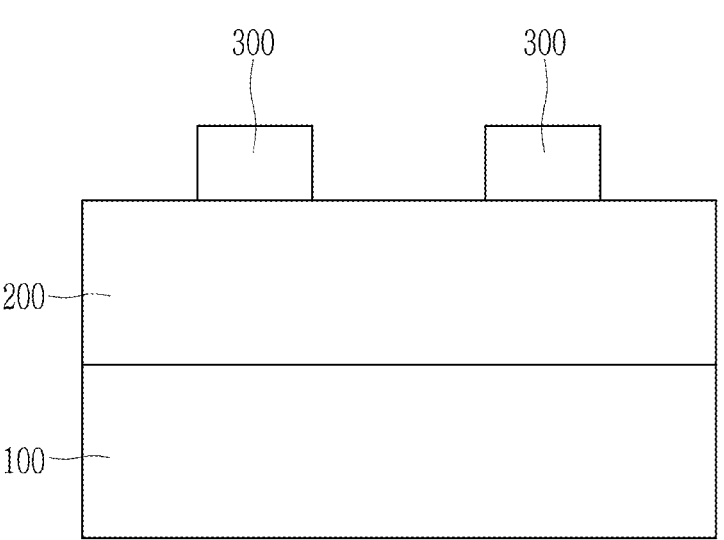
Figure 7B:
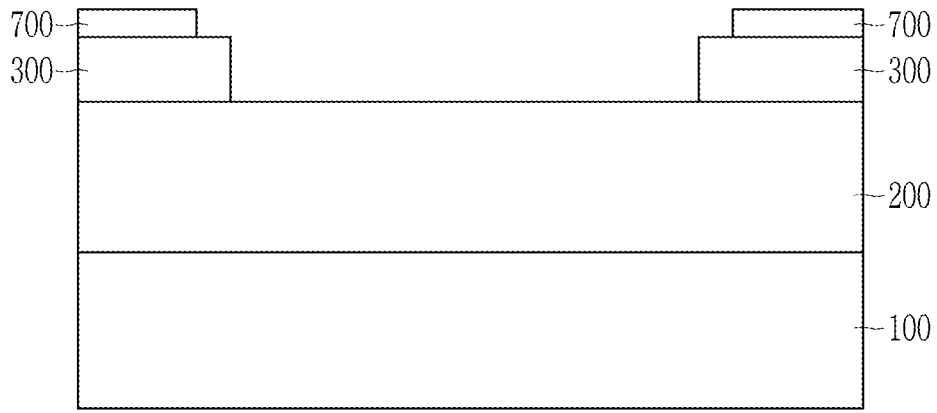

Referring to FIGS. 7A and 7B, after etching the n+ type epitaxial layer 700, a portion of the n− type epitaxial layer 300 may be etched. Herein, as shown in FIG. 7A, in a region where the gate electrode 600 is formed, a portion of the n− type epitaxial layer 300 may be etched to form a protruding structure.

Figure 8A:
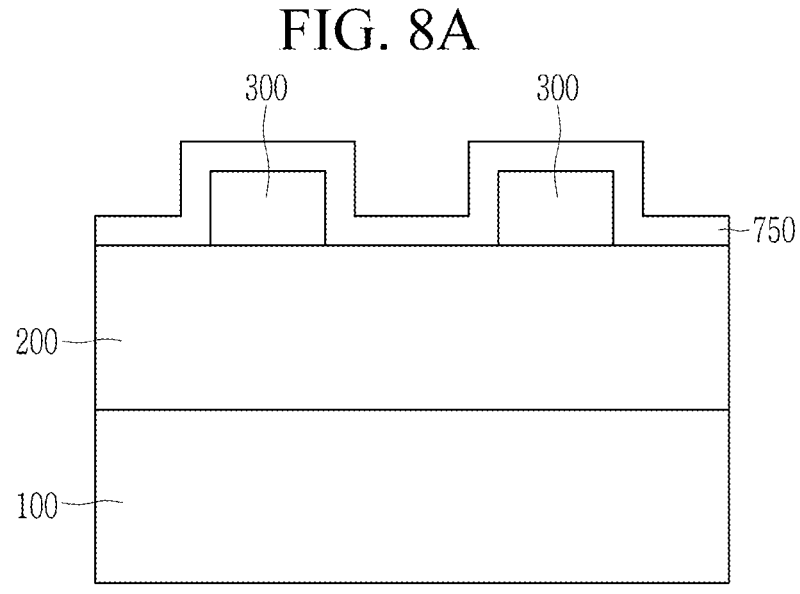
Figure 8B:
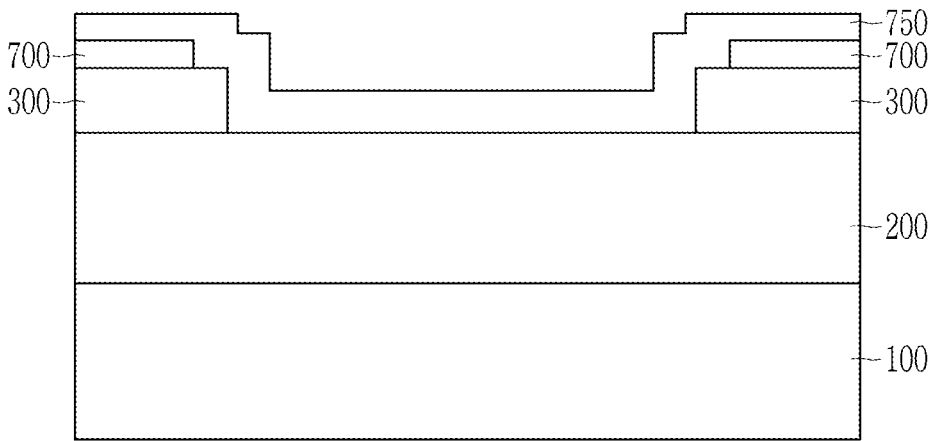

Referring to FIGS. 8A and 8B, a protective layer 750 is formed on the buffer layer 200 and the n− type epitaxial layer 300. In the step, as shown in FIG. 8A, in the region where the gate electrode 600 is formed, a protective layer 750 is formed along the protruding structure, that is, surrounding the protruding structure.

Figure 9A:
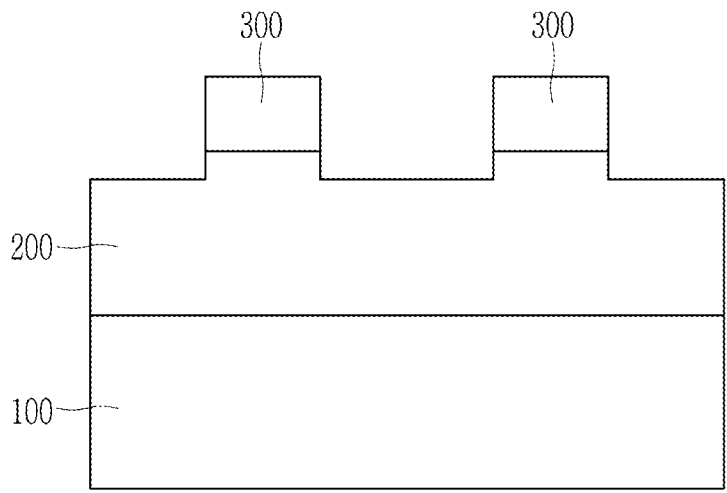
Figure 9B:
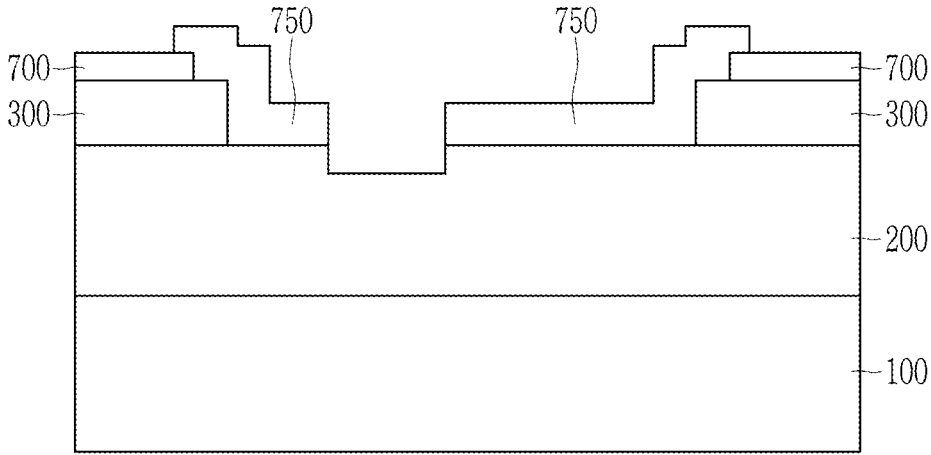

Referring to FIGS. 9A and 9B, the protective layer 750 and a portion of the buffer layer 200 may be etched.

Figure 10A:
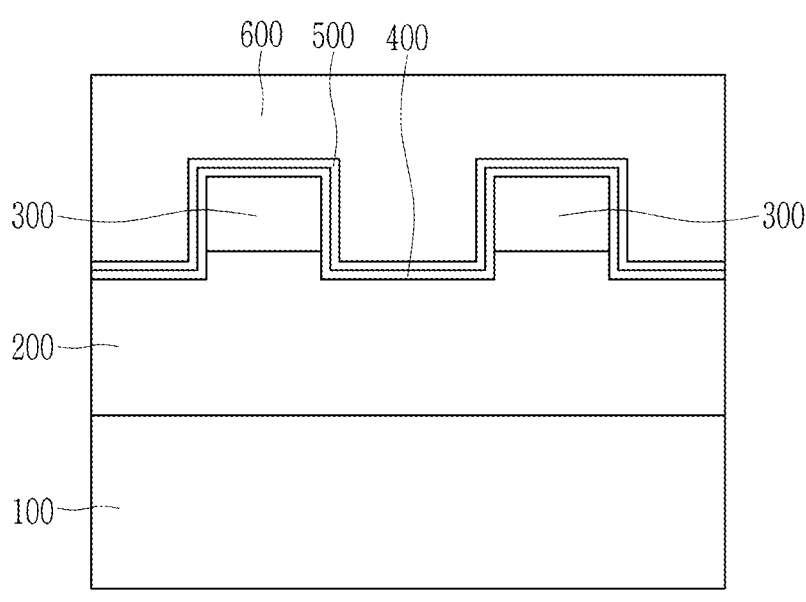
Figure 10B:
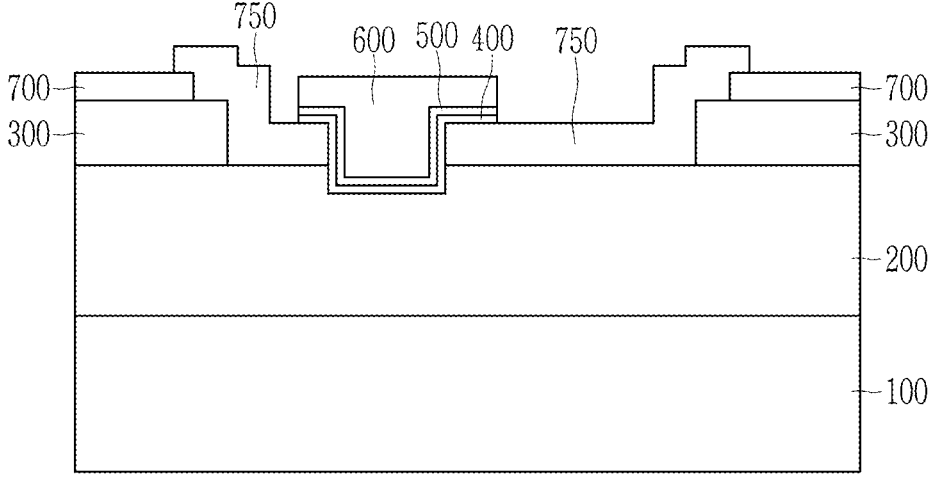

Referring to FIGS. 10A and 10B, on the partially etched buffer layer 200, the p type layer 400 is formed. Herein, as shown in FIG. 10A, in the region where the gate electrode 600 is formed, the p type layer 400 is formed on the buffer layer 200 and n− type epitaxial layer 300 partially etched along the protruding structure, that is, in the form of surrounding the protruding structure. The n− type epitaxial layer 300 surrounded with the p type layer 400 internally has a three dimensional fin channel.

The p type layer disposed on the buffer layer 200, that is, on the upper surface of the buffer layer 200 may be formed lower than the lower surface of the n− type epitaxial layer 300.

Subsequently, on the p type layer 400, the gate insulating layer 500 and the gate electrode 600 are sequentially formed.

The p type layer 400, the gate insulating layer 500, and the gate electrode 600 may be formed through a lift-off process or an etching process by sequentially depositing a p type layer material, a gate insulating layer material, and a gate electrode material. Herein, the lift-off process may be performed by etching a portion of the protective layer 750 and the buffer layer 200, applying and patterning a photoresist layer, sequentially depositing a p type layer material, a gate insulating material, and a gate electrode material, and then removing the photoresist layer.

Figure 11A:
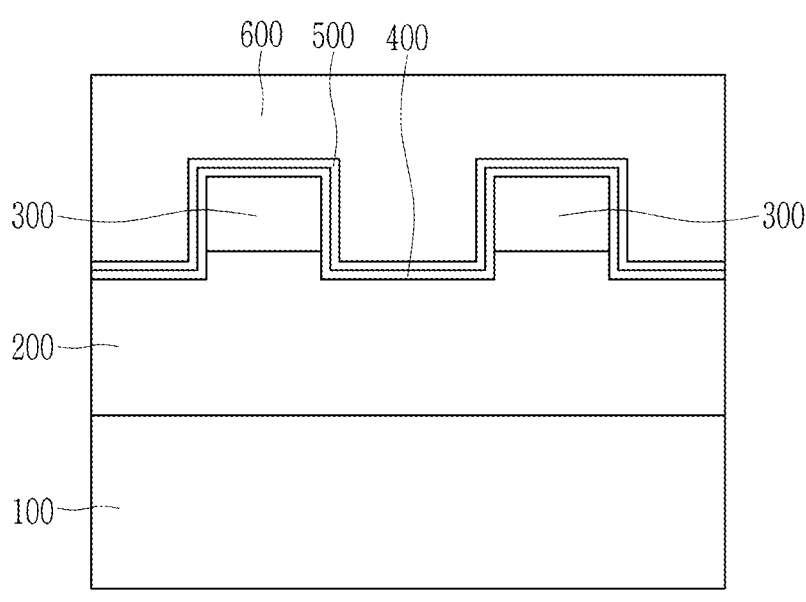
Figure 11B:
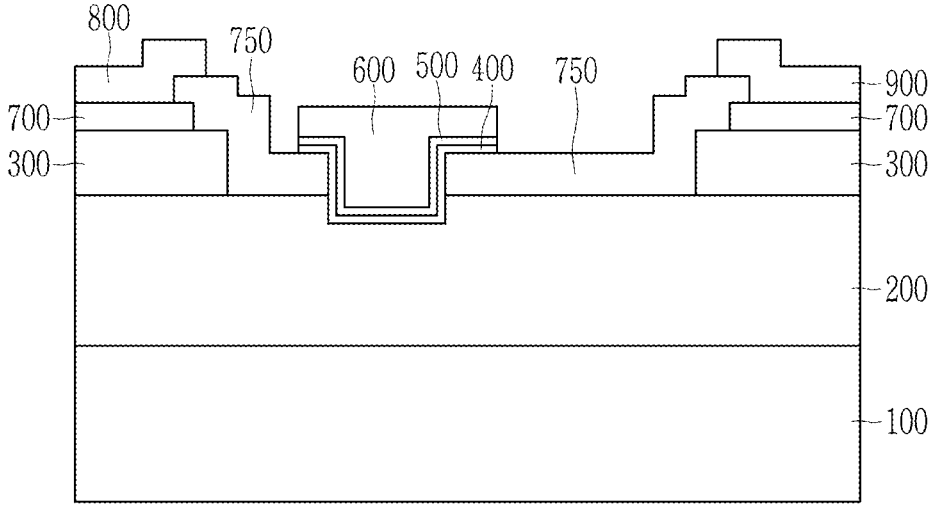

Referring to FIGS. 11A and 11B, after forming the gate electrode 600, as shown in FIG. 11B, the source electrode 800 and the drain electrode 900 may be formed on the n+ type epitaxial layer 700 and the protective layer 750.

The step of forming the source electrode 800 and the drain electrode 900 may be performed through a lift-off process or an etching process.

Specifically, the lift-off process may be performed by forming the gate electrode 600, applying and patterning a photoresist layer, depositing source electrode material and drain electrode material in order, and then removing the photoresist layer.

According to the aforementioned method of manufacturing a semiconductor device, it is possible to manufacture a semiconductor device with a MOSFET structure having an increased channel density while being able to implement normally-off operation without an ion implantation process.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor device, comprising
   a substrate;
   a buffer layer positioned on the substrate;
   an n− type epitaxial layer extending upward from the buffer layer in one direction, and having a fin channel;
   a p type layer positioned on the buffer layer and surrounding side and upper surfaces of the n− type epitaxial layer;
   a gate insulating layer positioned on the p type layer; and
   a gate electrode positioned on the gate insulating layer.

2. The semiconductor device of claim 1, wherein the semiconductor device includes:
   a source electrode disposed on one side at a distance from the gate electrode; and
   a drain electrode disposed on an other side at a distance from the gate electrode.

3. The semiconductor device of claim 2, wherein the semiconductor device further includes:
   an n+ type epitaxial layer disposed between the n-type epitaxial layer and the source electrode, and between the n-type epitaxial layer and the drain electrode at a position spaced apart from the gate electrode;
   a protective layer disposed on the buffer layer or on the n-type epitaxial layer in a region where the gate electrode is not disposed;
   or a combination thereof.

4. The semiconductor device of claim 1, wherein the p type layer on the buffer layer is disposed lower than a lower surface of the protruding n-type epitaxial layer.

5. The semiconductor device of claim 1, wherein the p type layer includes $NiO_X$ ($0.98 \leq x \leq 1$).

6. The semiconductor device of claim 1, wherein the buffer layer includes unintentionally doped (UID) gallium oxide.

7. The semiconductor device of claim 1, wherein the n-type epitaxial layer includes n-type gallium oxide.

8. The semiconductor device of claim 7, wherein the n-type epitaxial layer has a concentration of about $1E16$ $cm^{-3}$ to about $1E19$ $cm^{-3}$.

9. The semiconductor device of claim 1, wherein the gate insulating layer includes $Al_2O_3$, $SiO_2$, $HfO_2$, $Si_2N_3$, or a combination thereof.

10. The semiconductor device of claim 3, wherein the protective layer includes $SiO_2$, $Si_2N_3$, or a combination thereof.

11. The semiconductor device of claim 3, wherein the n+ type epitaxial layer includes n+ type gallium oxide.

* * * * *